US012804296B2

(12) United States Patent
Do et al.

(10) Patent No.: US 12,804,296 B2
(45) **Date of Patent: *Nov. 17, 2026**

(54) APPARATUS AND METHOD FOR MEMS MICROPHONE PERFORMANCE VIA BACK VOLUME

(71) Applicant: Harman International Industries, Incorporated, Stamford, CT (US)

(72) Inventors: Sullivan Do, Ypsilanti, MI (US); Yu Du, Chicago, IL (US)

(73) Assignee: Harman International Industries, Incorporated, Stamford, CT (US)

( * ) Notice: Subject to any disclaimer, the term of this patent is extended or adjusted under 35 U.S.C. 154(b) by 114 days.

This patent is subject to a terminal disclaimer.

(21) Appl. No.: 18/986,338

(22) Filed: Dec. 18, 2024

(65) Prior Publication Data

US 2025/0254453 A1 Aug. 7, 2025

Related U.S. Application Data

(62) Division of application No. 18/517,963, filed on Nov. 22, 2023, now Pat. No. 12,219,312, which is a (Continued)

(51) Int. Cl.
*H04R 1/04* (2006.01)
*B81B 7/02* (2006.01)
(Continued)

(52) U.S. Cl.
CPC ................ *H04R 1/04* (2013.01); *B81B 7/02* (2013.01); *H04R 1/222* (2013.01); *H04R 1/2896* (2013.01);
(Continued)

(58) Field of Classification Search
CPC ........ H04R 1/04; H04R 1/222; H04R 1/2896; H04R 19/04; H04R 2201/003; B81B 7/02; B81B 2201/0257
(Continued)

(56) References Cited

U.S. PATENT DOCUMENTS 8,428,286 B2 * 4/2013 Fueldner ................ H04R 31/00 381/175
9,955,246 B2 4/2018 Reese et al.
(Continued)

FOREIGN PATENT DOCUMENTS

| | | | |
|---|---|---|---|
| WO | 2017027242 | A1 | 2/2017 |
| WO | 2019055437 | A1 | 3/2019 |
| WO | 2021216058 | A1 | 10/2021 |

OTHER PUBLICATIONS

European Search Report dated May 9, 2023 for European Patent Application No. 22199619.2, 11 pages.
(Continued)

*Primary Examiner* — William A Jerez Lora
(74) *Attorney, Agent, or Firm* — Brooks Kushman P.C.

(57) ABSTRACT

In at least one embodiment, a microphone assembly including a substrate, a printed circuit board (PCB), a micro-electro-mechanical systems (MEMS) transducer, a first lid, and a second lid is provided. The substrate defines a first port that extends completely therethrough. The PCB defines a sound opening that extends completely therethrough. The MEMS transducer is positioned on a first side of the substrate. The first lid defines a second port and covers the MEMS transducer and the first port. The first lid and the substrate define a front volume of air that surrounds the MEMS transducer. The second lid is positioned on the second side of the PCB. A cavity of the second lid, the sound opening of the PCB, the sound opening of the PCB, and the
(Continued)

first port of the substrate define a back volume of air that is greater than the front volume of air.

4 Claims, 8 Drawing Sheets

Related U.S. Application Data division of application No. 17/499,440, filed on Oct. 12, 2021, now Pat. No. 11,863,925.

(51) Int. Cl.
*H04R 1/22* (2006.01)
*H04R 1/28* (2006.01)
*H04R 19/04* (2006.01)

(52) U.S. Cl.
CPC ...... *H04R 19/04* (2013.01); *B81B 2201/0257* (2013.01); *H04R 2201/003* (2013.01)

(58) Field of Classification Search
USPC .......................................................... 381/113
See application file for complete search history.

(56) References Cited

U.S. PATENT DOCUMENTS

| | | | | |
|---|---|---|---|---|
| 10,154,330 | B2 | 12/2018 | Baumhauer, Jr. et al. | |
| 11,956,599 | B2 * | 4/2024 | Isaacson | A61N 1/3758 |
| 2008/0123891 | A1 | 5/2008 | Kato et al. | |
| 2010/0052082 | A1 | 3/2010 | Lee et al. | |
| 2011/0127623 | A1 * | 6/2011 | Fueldner | H04R 31/00 438/51 |
| 2017/0215001 | A1 * | 7/2017 | Harney | H04R 1/04 |
| 2023/0097786 | A1 * | 3/2023 | Leahy | H04R 1/2853 257/416 |

OTHER PUBLICATIONS

Partial European Search Report dated Feb. 6, 2023 for European Patent Application No. 22199619.2, 12 pages.
Non-Final Office Action; related U.S. Appl. No. 17/499,440; date of mailing May 16, 2023, 18 pgs.
Extended European Search Report of Application No. 25197290.7-1207, dated Dec. 9, 2025, 8 pages.

* cited by examiner

APPARATUS AND METHOD FOR MEMS MICROPHONE PERFORMANCE VIA BACK VOLUME

CROSS-REFERENCE TO RELATED APPLICATIONS

This application is a divisional of U.S. application Ser. No. 18/517,963 filed Nov. 22, 2023, now U.S. Pat. No. 12,219,312 issued on Feb. 4, 2025, which is a divisional of U.S. application Ser. No. 17/499,440 filed Oct. 12, 2021, now U.S. Pat. No. 11,863,925 issued on Jan. 2, 2024, the disclosures of which are hereby incorporated in their entirety by reference herein.

TECHNICAL FIELD

Aspects disclosed herein generally provide for an apparatus and method for a micro-electro-mechanical systems (MEMS) microphone performance including, but not limited to, signal to noise ratio (SNR) and low frequency cut off enhancement via externally added back volume. This aspect and others will be discussed in more detail below.

BACKGROUND

A MEMS microphone structure or assembly generally includes a MEMS transducer and electronics mounted on a printed circuit board (PCB). A lid or housing may be provided to enclose the transducer, the electronics and the PCB. One or more sound ports are provided to enable sound to travel to the MEMS transducer.

SUMMARY

In at least one embodiment, a microphone assembly including a substrate, a printed circuit board (PCB), a micro-electro-mechanical systems (MEMS) transducer, a first lid, and a second lid is provided. The substrate defines a first port that extends completely therethrough. The PCB defines a sound opening that extends completely therethrough. The MEMS transducer is positioned on a first side of the substrate and being positioned directly above the above the first port and the sound opening. The first lid defines a second port and covers the MEMS transducer and the first port, and the first port being axially displaced from the second port, the first lid and the substrate define a front volume of air that surrounds the MEMS transducer. The second lid is positioned on the second side of the PCB. A cavity of the second lid, the sound opening of the PCB, the sound opening of the PCB, and the first port of the substrate define a back volume of air that is greater than the front volume of air to increase a signal-to-noise-ratio (SNR) and to increase an overall frequency response for the microphone assembly.

In at least one embodiment, a microphone assembly including a substrate, a printed circuit board (PCB), a micro-electro-mechanical systems (MEMS) transducer, and a first lid is provided. The substrate defines a first port that extends completely therethrough. The PCB defines a first cavity that is embedded within the PCB. The first port of the substrate is aligned with the first cavity about an axis that extends through the first port and the first cavity. The MEMS transducer is positioned on a first side of the substrate and being positioned directly above the first port and the first cavity. The first lid defines a second port and covers the MEMS transducer and the first port. The first port is axially displaced from the second port. The first lid and the substrate define a front volume of air that surrounds the MEMS transducer. The first cavity of the PCB, and the first port of substrate define a back volume of air that is greater than the front volume of air to increase a signal-to-noise-ratio (SNR) and to increase an overall frequency response for the microphone assembly.

In at least another embodiment, a microphone assembly including a substrate, a printed circuit board (PCB), a micro-electro-mechanical systems (MEMS) transducer, a first lid, a least a portion of a housing is provided. The substrate defines a first port that extends completely therethrough. The PCB defines a sound opening that extends completely therethrough. The MEMS transducer positioned on a first side of the substrate and being positioned directly above the first port and the sound opening. The first lid defines a second port and covers the MEMS transducer and the first port. The first port is axially displaced from the second port. The first lid and the substrate define a front volume of air that surrounds the MEMS transducer. The at least a portion of a housing is positioned on the second side of the PCB and opposite to the first side of the PCB and defining a cavity. The cavity of the at least the portion of the housing, the sound port of the PCB, and the first port of substrate define a back volume of air that is greater than the front volume of air to increase a signal-to-noise-ratio (SNR) and to increase an overall frequency response for the microphone assembly.

In at least another embodiment, a microphone assembly including a substrate, a printed circuit board (PCB), a micro-electro-mechanical systems (MEMS), a first lid, and at least a portion of a housing is provided. The substrate defines a first port that extends completely therethrough. The printed circuit board (PCB) defines a sound opening that extends completely therethrough. The MEMS transducer is positioned on a first side of the substrate and is positioned directly above the first port and the sound opening. The first lid defines a second port and covers the MEMS transducer and the first port. The first port is axially displaced from the second port. The first lid and the substrate define a front volume of air that surrounds the MEMS transducer. The at least a portion of a housing is positioned on the second side of the PCB and opposite to the first side of the PCB and defining a cavity. The cavity of the at least the portion of the housing, the sound port of the PCB, and the first port of substrate define a back volume of air that is greater than the front volume of air to increase a signal-to-noise-ratio (SNR) and to increase an overall frequency response for the microphone assembly.

In at least another embodiment, a microphone assembly including a micro-electro-mechanical systems (MEMS) transducer, an enclosure, and a plurality of substrate layers. The enclosure covers the MEMS transducer and define a first volume therein. The plurality of substrate layers supports the MEMS transducer. The first substrate layer of the plurality of substrate layers defines an opening to enable a first side of the MEMS transducer to directly receive an audio input signal from an ambient environment. The plurality of substrate layers defines a transmission mechanism including a seal positioned therein to completely block the audio input signal from being received by the MEMS transducer. The seal and the transmission mechanism define a second volume. The first volume and the second volume form a back volume to increase a frequency response for the assembly.

In at least another embodiment, a microphone assembly including a micro-electro-mechanical systems (MEMS)

transducer, an enclosure, and a plurality of substrate layers. The enclosure covers the MEMS transducer and define a first volume therein. The plurality of substrate layers support the MEMS transducer. The first substrate layer of the plurality of substrate layers defines an opening to enable a first side of the MEMS transducer to directly receive an audio input signal from an ambient environment. The plurality of substrate layers defines a transmission mechanism including a seal positioned therein to completely block the audio input signal. The seal and the transmission mechanism define a second volume. The first volume and the second volume form a back volume to increase a frequency response for the assembly.

In at least another embodiment, a method for tuning a microphone assembly is provided. The method includes covering a micro-electro-mechanical systems (MEMS) transducer with an enclosure to define a first volume therein and supporting the MEMS transducer via a plurality of substrate layers. The method includes directly receiving an audio input signal from an ambient environment at a first side of the MEMS transducer via an opening that is defined by a first substrate layer of the plurality of substrate layers and defining a transmission mechanism with the plurality of substrate layers. The method further includes positioning a seal in the transmission mechanism to completely block the audio input signal and defining a second volume by the seal and the transmission mechanism. The method further includes increasing a frequency response for the assembly with a back volume that is formed by the first volume and the second volume.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

It is recognized that directional terms that may be noted herein (e.g., "upper", "lower", "inner", "outer", "top", "bottom", etc.) simply refer to the orientation of various components of the microphone assembly as illustrated in the accompanying figures. Such terms are provided for context and understanding of the embodiments disclosed herein.

Microphone Assembly with Front Volume and Back Volume

Figure 1A:
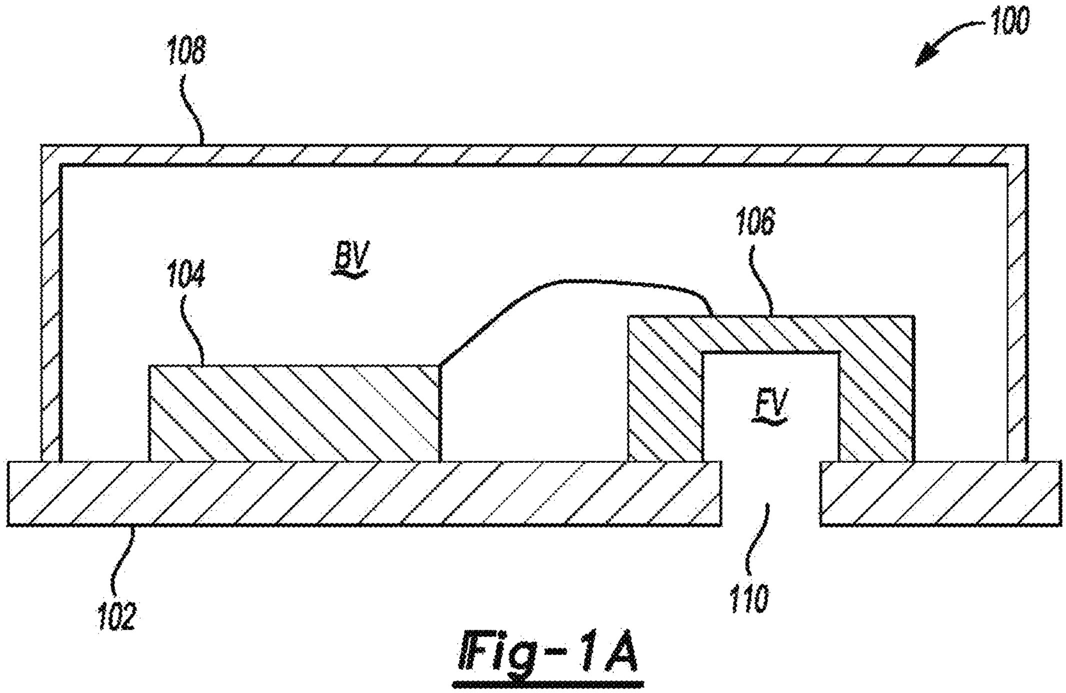
FIGS. 1A-1B depict cross-sectional views of a bottom port MEMS microphone sub-assembly and a top port MEMS microphone sub-assembly.
Figure 1B:
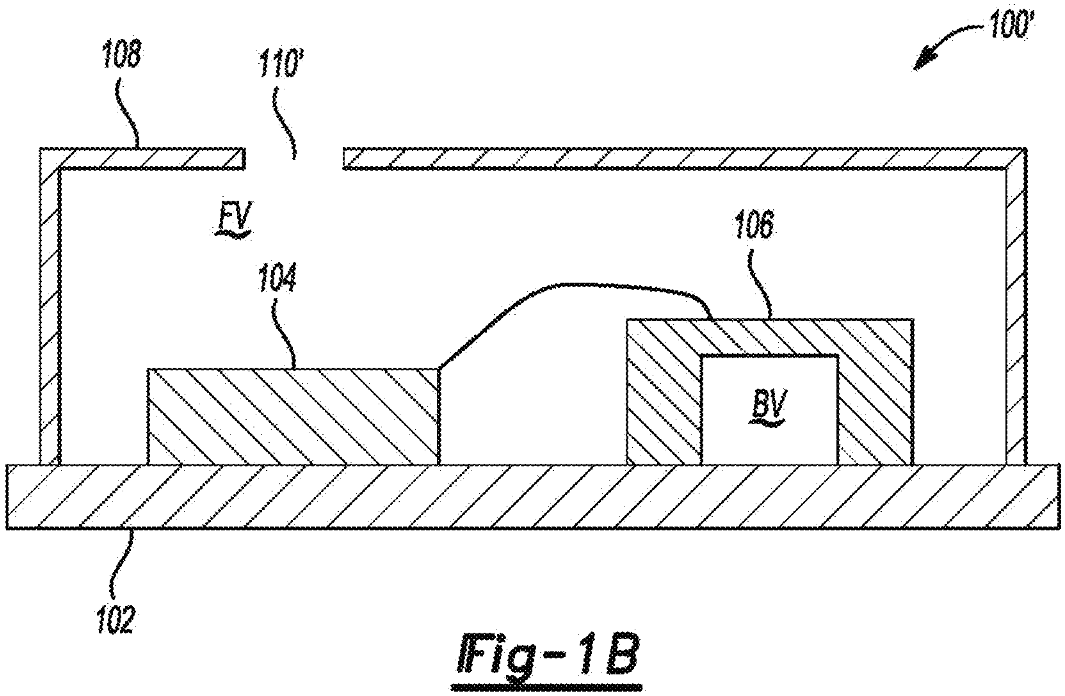

FIG. 1A depicts a cross-sectional view of a bottom port MEMS microphone sub-assembly 100. The MEMS microphone sub-assembly 100 includes a substrate 102, electronics (or, for example, an application specific integrated circuit (ASIC)) 104, and a MEMS transducer 106. The ASIC 104 and the MEMS transducer 106 are mounted on the substrate 102. The assembly 100 includes a lid 108 that encloses the ASIC 104 and the transducer 106. The substrate 102 defines a port 110 that enables ambient sound to pass to the transducer 106. In this case, the port 110 is positioned below or directly underneath the transducer 106 and is characterized as a bottom port. A microphone sub-assembly 100' of FIG. 1B also includes the substrate 102, the ASIC 104, the MEMS transducer 106, and the lid 108. The lid 108 of the assembly 100' defines a port 110' being positioned on a top surface of the lid 108. In this case, the port 110 is positioned above the transducer 106 and is characterized as a top port.

In general, each of the sub-assemblies 100 and 100' defines an air volume within the lid 108. The air volume included within the lid 108 of the sub-assembly 100 may be defined as a back volume (BV) (e.g., air positioned in a back chamber of the sub-assembly 100 that is behind the transducer 106 in reference to the location of the port 110) and the air volume included within the lid 108 of the sub-assembly 100' may be defined as a front volume (FV) (e.g., air positioned in a front chamber of the sub-assembly 100' that is in front of the transducer 106 in reference to the location of the port 110'). In one example, the FV may be defined to be the chamber closest to a port 110 or 110' in reference to FIGS. 1A and 1B. A signal-to-noise-ratio (SNR) for the captured ambient sound may be proportional to the BV based on MEMS microphone design principles. The sub-assembly 100 (e.g., see FIG. 1A) provides a much larger BV than that of the sub-assembly 100' (e.g., FIG. 1B). Thus, in this regard, the larger BV provides improved SNR performance. Therefore, the sub-assembly 100 may be preferred over the sub-assembly 100' to achieve higher SNR performance.

Figure 2A:
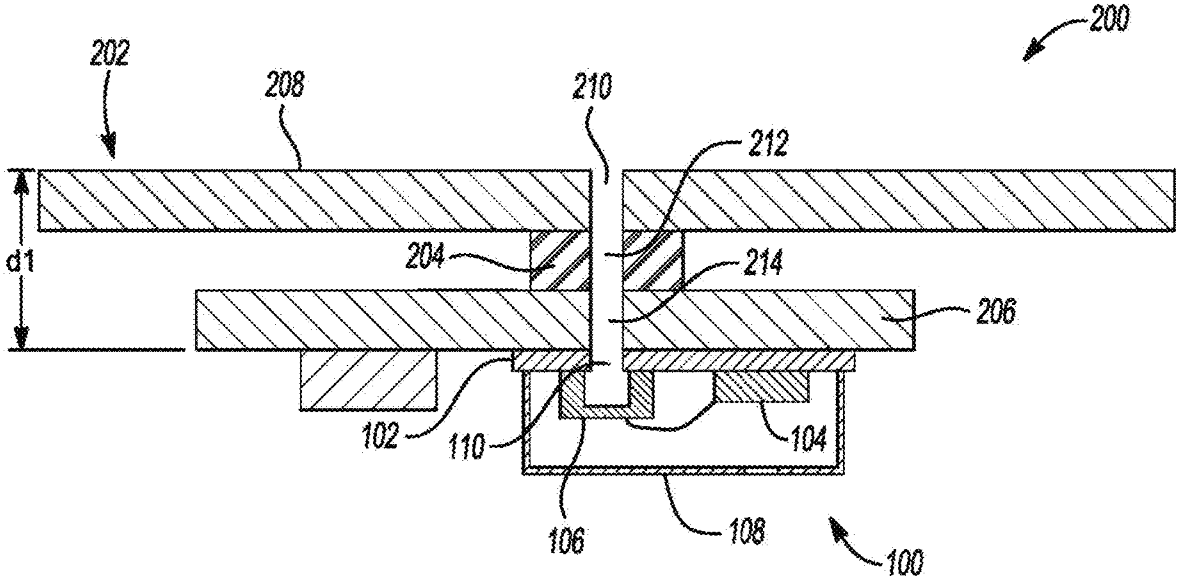
FIGS. 2A-2B depict alternate cross-sectional views of an application microphone assembly using a bottom port MEMS microphone sub-assembly and a top port MEMS microphone sub-assembly, respectively.

FIG. 2A depicts a cross-sectional view of an application microphone assembly 200 (e.g., an automotive microphone module) using the MEMS microphone sub-assembly 100 (e.g., bottom port MEMS microphone sub-assembly in accordance with one embodiment. The assembly 200 generally includes the bottom port MEMS microphone sub-assembly 100, a housing 202, a gasket 204, and an application printed circuit board (PCB) 206 (hereafter "PCB 206"). The sub-assembly 100 is generally mounted to the PCB 206. The ASIC 104 and the transducer 106 are electrically coupled to the PCB 206 via connections (not shown) through the substrate 102. The gasket 204 couples the PCB 206 on which the sub-assembly 100 is mounted to one side (or a wall) 208 of the housing 202 and forms an acoustic seal between the side 208 of the housing 202 and the PCB 206. The side 208 of the housing 202 defines a sound aperture 210, the gasket 204 defines a sound hole 212 and the PCB 206 defines a sound opening 214. The sound aperture 210, the sound hole 212, the sound opening 214 and the port 110 are axially aligned with one another to enable external sound to pass therethrough and to the transducer 106. A distance "d1" for the system 200 is generally defined as an overall length of the sound aperture 210, the sound hole 212, and the sound opening 214. The distance "d1" connects the port 110 to the external sound field which is provided to the transducer 106. To ensure a smooth and consistent frequency response shape in the entire audio band (i.e., to pick up or sense audio data in the entire audio band), it may be desirable to minimize the distance d1.

Figure 2B:
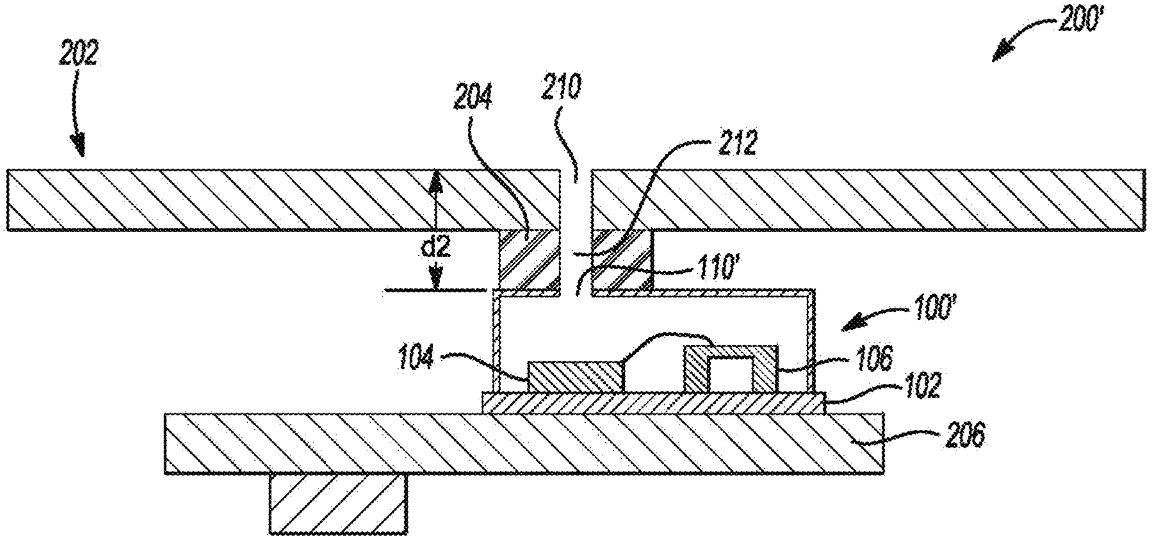

FIG. 2B depicts a cross-sectional view of an application microphone assembly 200' (e.g., an automotive microphone assembly) using the MEMS microphone sub-assembly 100' (e.g., top port MEMS microphone sub-assembly 100' in accordance with one embodiment. The assembly 200' generally includes the sub-assembly 100', the housing 202, the gasket 204, and the PCB 206. The sub-assembly 100' is generally mounted to the PCB 206. Similar to the system 200 of FIG. 2A, the ASIC 104 and the transducer 106 are electrically coupled to the PCB 206 via connections (not shown) through the substrate 102. The gasket 204 directly couples the top port MEMS microphone sub-assembly 100' to one side (or a wall) 208 of the housing 202 and forms an acoustic seal between the side 208 of the housing 202 and the lid 108 of the top port MEMS microphone sub-assembly 100'. The side 208 of the housing 202 defines a sound aperture 210 and the gasket 204 defines a sound hole 212. The port 110', the sound aperture 210, and the sound hole 212 are axially aligned with one another to enable external sound to pass therethrough and to the transducer 106. A distance "d2" for the system 200 is generally defined as an overall length of the sound aperture 210, the sound hole 212, and the port 110'. When comparing the system 200' to the system 200, it is shown that the distance d2 does not include a sound opening 214 defined by the PCB 206. Therefore, it is shorter in length than that of the distance d1. Furthermore, it is recognized that the length of the port 110' defined by the thickness of the lid 108 is sufficiently smaller than that of the port 110 defined by the thickness of the substrate 102 in the MEMS microphone sub-assembly 100 or 100'. Thus, in this regard, the system 200' may be preferred over the system 200 because the overall acoustic pathway connecting the external sound field and the sound field immediately seen by the MEMS transducer 106 is shorter, resulting in a more consistent frequency response that more closely represents the characteristics of the external sound field of interest. While the system 200' may be preferred over the system 200, implementing either the system 200 or 200' may be difficult based on current MEMS microphone implementations. In one regard, a performance tradeoff may be necessary.

Figure 3:
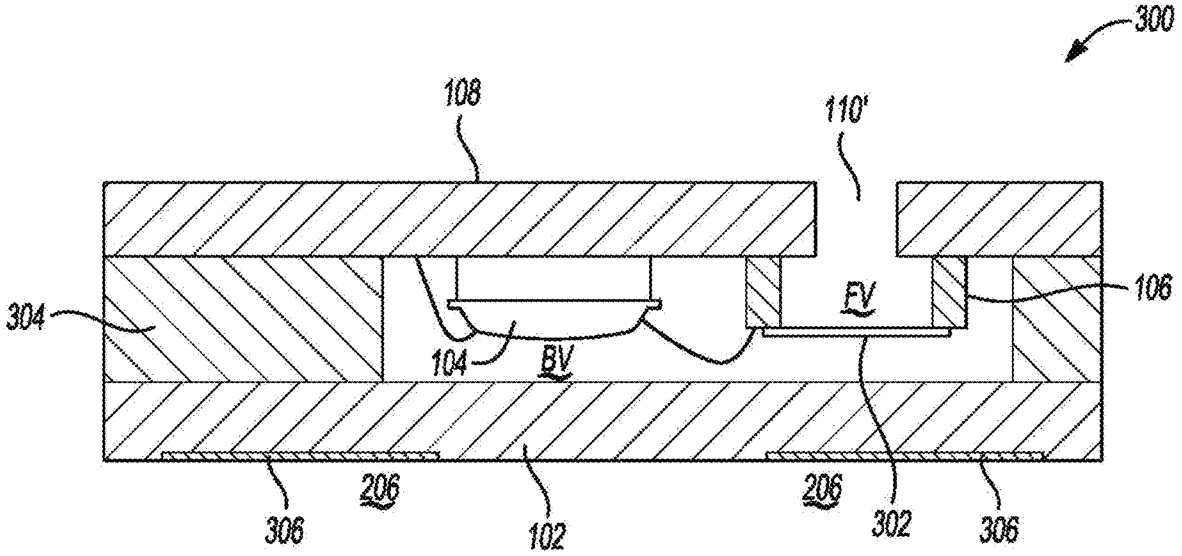
FIG. 3 depicts another MEMS microphone sub-assembly.

FIG. 3 depicts another MEMS microphone sub-assembly 300. The sub-assembly 300 includes the substrate 102, the ASIC 104, the transducer 106, the lid 108, and the top port 110' (or port 110'). The transducer 106 includes a diaphragm 302. A wall 304 is positioned between the substrate 102 and the lid 108. Solder pads 306 are also provided on a bottom section of the substrate to attach to the PCB 206 (not shown). The assembly 300 generally represents one solution to the problem described in connection with the systems 200, 200'. For example, the ASIC 104 and the MEMS transducer 106 may be mounted to the lid 108 as opposed to the substrate 102 of the MEMS microphone sub-assembly 300. As noted above, the port 110' may be defined as a top-port or the sub-assembly 300 itself may be defined as a top-port MEMS microphone sub-assembly 300. However, in comparison to the sub-assembly 100' as illustrated in connection with FIG. 1B, the top-port MEMS microphone assembly 300 flips BV and FV. The system 300 generally provides for a large BV and improved signal to noise ratio (SNR). However, the system 300 may have some limitations.

For example, to supply power to and to receive a signal from the MEMS transducer 106 and the ASIC 104, electrical connections are needed through the wall 304 and also through the lid 108 on which the ASIC 104 and the transducer 106 are mounted to. In this case, the system 300 may not be able to utilize a metal-based lid 108, which degrades EMI/EMC performance of the microphone 300. This may also be more complex and costly to the manufacturer. In addition, the non-metal lid 108 and the wall 304 may generally need to be thicker than a metallic lid, which in turn takes up space. In general, however, the BV and SNR of the system 300 may still yield better performance than the sub-assembly 100' as set forth in FIG. 1B but may not be as optimal than the sub-assembly 100 as set forth in FIG. 1A. It may be commonplace for design tradeoffs to either select a bottom-port MEMS microphone assembly (e.g., see assembly 200 of FIG. 2A) to achieve better SNR or to select a top-port MEMS microphone assembly (e.g., see assembly 200' of FIG. 2B) for improved frequency response but worse SNR.

Figure 4:
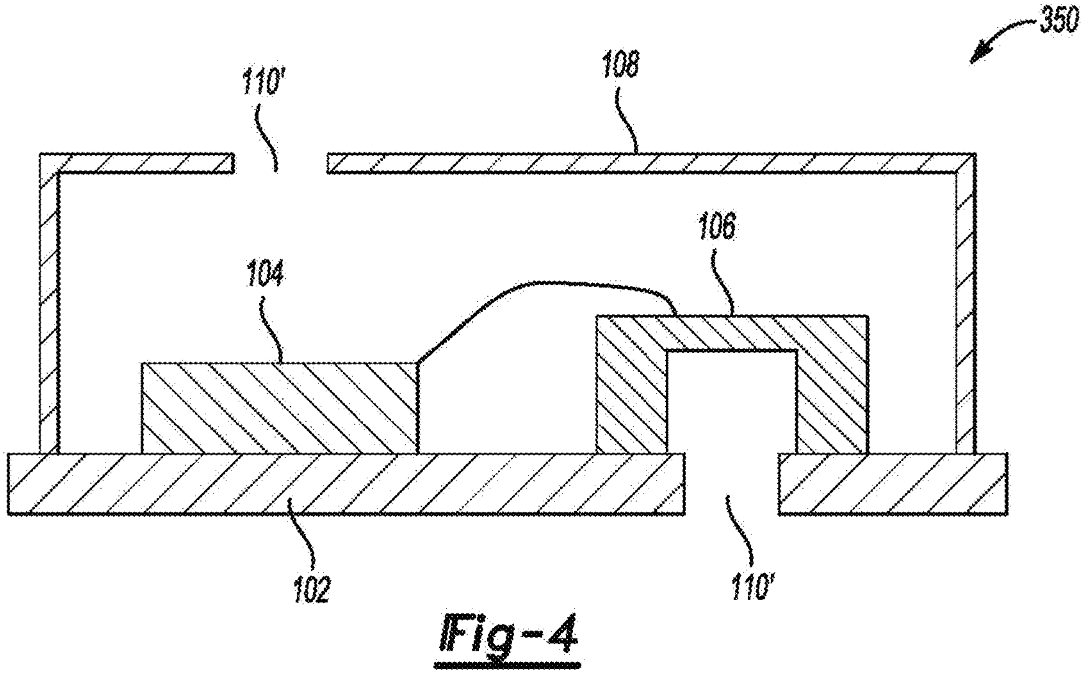
FIG. 4 depicts a first MEMS microphone sub-assembly in accordance with another embodiment.

FIG. 4 depicts a first MEMS microphone (or dual port MEMS microphone) sub-assembly 350 in accordance with one embodiment. The assembly 350 also includes the substrate 102, the ASIC 104, the MEMS transducer 106, and the lid 108. The sub-assembly 350 provides the port 110 in the substrate 102 and the port 110' in the lid 108. Thus, in this regard, the sub-assembly 350 may be referred to as a "dual port MEMS microphone". Different from the MEMS microphone sub-assembly depicted in FIG. 3, the ASIC 104 and the MEMS transducer 106 in the sub-assembly 350 are attached to the substrate 102 instead of the lid 108. The sub-assembly 350 may be manufactured by soldering the lid 108 along with the port 110' to the substrate 102 along with the port 110. After the soldering operation, the lid 108 may enclose the ASIC 104 and the transducer 106. With the dual port MEMS microphone (or sub-assembly 350), the characterizations of the FV and the BV (or the relative locations of the FV and the BV) are configurable based on whether the port 110 is positioned in the substrate 102 or the port 110' is positioned in the lid 108 and is directly connected to the external sound field of interest.

Figure 5:
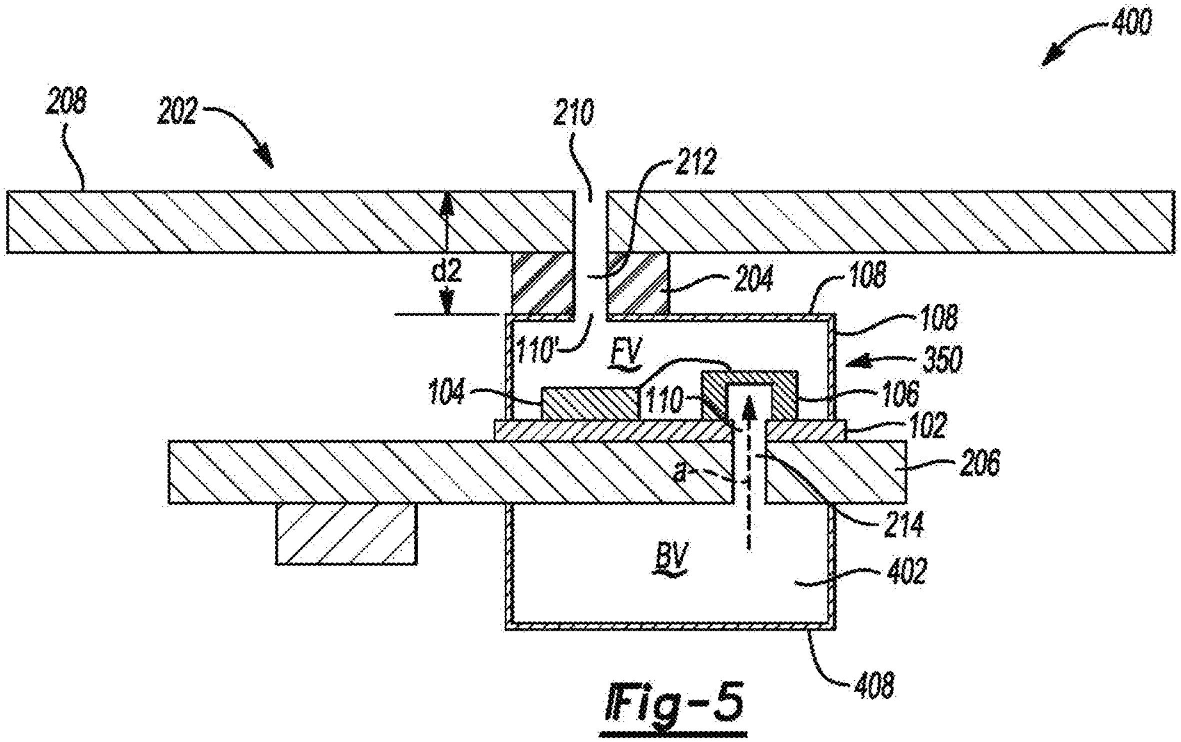
FIG. 5 depicts a cross-sectional view of a first application microphone assembly using a dual-port MEMS microphone sub-assembly in accordance with another embodiment.

FIG. 5 depicts a cross-sectional view of a first application microphone assembly 400 using a dual-port MEMS microphone sub-assembly 350 in accordance with another embodiment. The assembly 400 generally includes the housing 202, the gasket 204, and the PCB 206. The sub-assembly 350 includes the substrate 102, the ASIC 104, the transducer 106, and the lid 108 (or first lid). The sub-assembly 350 is generally mounted to the PCB 206. As similarly noted above, the ASIC 104 and the transducer 106 are electrically coupled to the PCB 206 via connections (not shown) through the substrate 102. The gasket 204 couples the sub-assembly 350 to the wall 208 of the housing 202 and forms an acoustic seal between the lid 108 of the sub-assembly 350 and the wall 208 of the housing 202. The wall 208 of the housing 202 defines the sound aperture 210, the gasket 204 defines the sound hole 212, and the PCB 206 defines the sound opening 214. As shown, the distance "d2" is generally defined as an overall length of the sound aperture 210 and the sound hole 212. The distance d2 provides a minimal distance as discussed in connection with FIG. 2B and enables the assembly 400 to achieve a more consistent frequency response over the entire audio range.

A second lid 408 is provided on an underside of the PCB 206 and defines a volume (or cavity 402) along with the PCB 206. The second lid 408 may be soldered to the underside of the PCB 206. The sound aperture 210, the sound hole 212, and the port 110' are axially aligned with one another to enable external sound to pass therethrough and to the transducer 106. The port 110 and the sound opening 214 are axially aligned with one another and provide the BV along with the cavity 402. For example, the port 110 and the sound opening 214 may be axially aligned with an axis a that extends vertically and centrally through the MEMS transducer 106. Thus, the volume 402 enclosed by the second lid 408 along with the port 110, the sound opening 214 and the air volume trapped between the MEMS transducer 106 and the substrate 102 provide a greater BV as discussed in connection with the assembly 200 of FIG. 2A. For example, the second lid 408 defines a cavity 402 that forms the air volume to provide greater BV. As also noted in connection FIG. 2A, the larger amount of BV leads to an improved SNR. Thus, in this regard, the system 400 achieves both the more consistent frequency response over the entire audio range due to the shorter distance d2 and improved SNR performance due to the inclusion of the lid 408, the port 110, and the sound opening 214.

Figure 6:
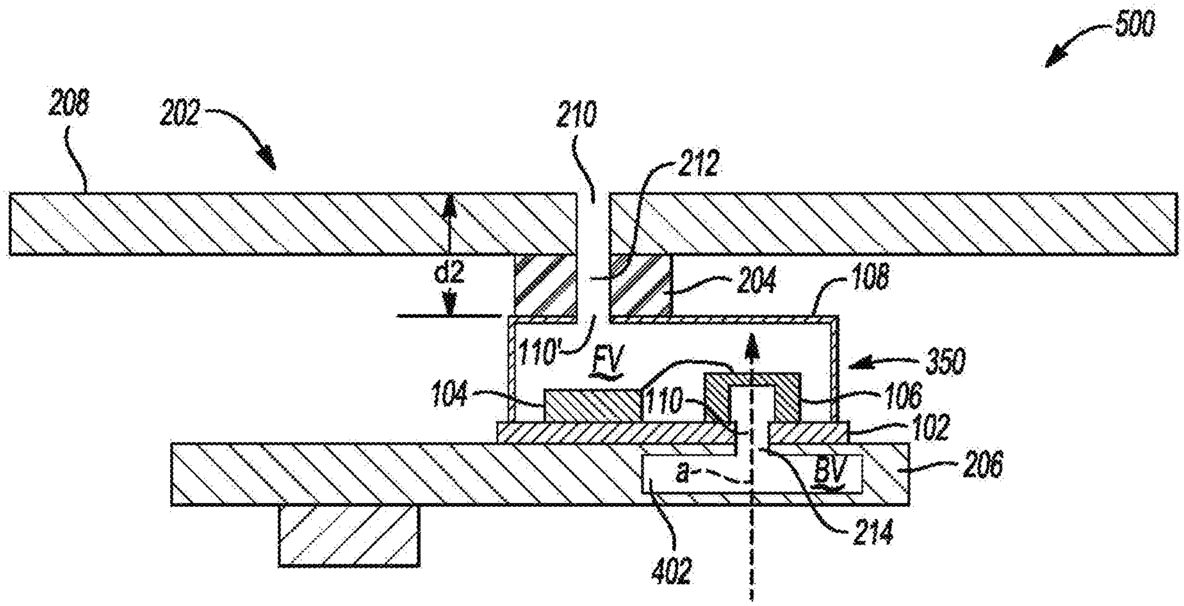
FIG. 6 depicts a cross-sectional view of a second application microphone assembly using a dual-port MEMS microphone sub-assembly in accordance with another embodiment.

FIG. 6 depicts a cross-sectional view of a second application microphone assembly 500 using a dual-port MEMS microphone sub-assembly 350 in accordance with another embodiment. The assembly 500 is generally similar to the assembly 400 of FIG. 5 with the exception of the second lid 408 which is replaced by the PCB 206 defining the cavity 402 (i.e., the cavity 402 may be embedded within the PCB 206) to provide the BV. The port 110 connects the air volume trapped between the transducer 106 and the substrate 102 to the cavity 402 to form the BV. The BV formed by the assembly 500 may be large enough to provide the improved SNR. Since the PCB 206 may be generally formed from 4 to 6 layers of FR4 layers, the cavity 402 may be easily formed by cutting holes of different shapes and sizes in different FR4 layers and then stacking such layers together.

Thus, with the BV, the assembly 500 may provide the improved SNR. In addition, the distance d2 does not change in reference to the distance d2 as illustrated in connection with FIG. 5. Therefore, this minimum distance d2 provides for a more consistent frequency response over the entire audio range.

Figure 7:
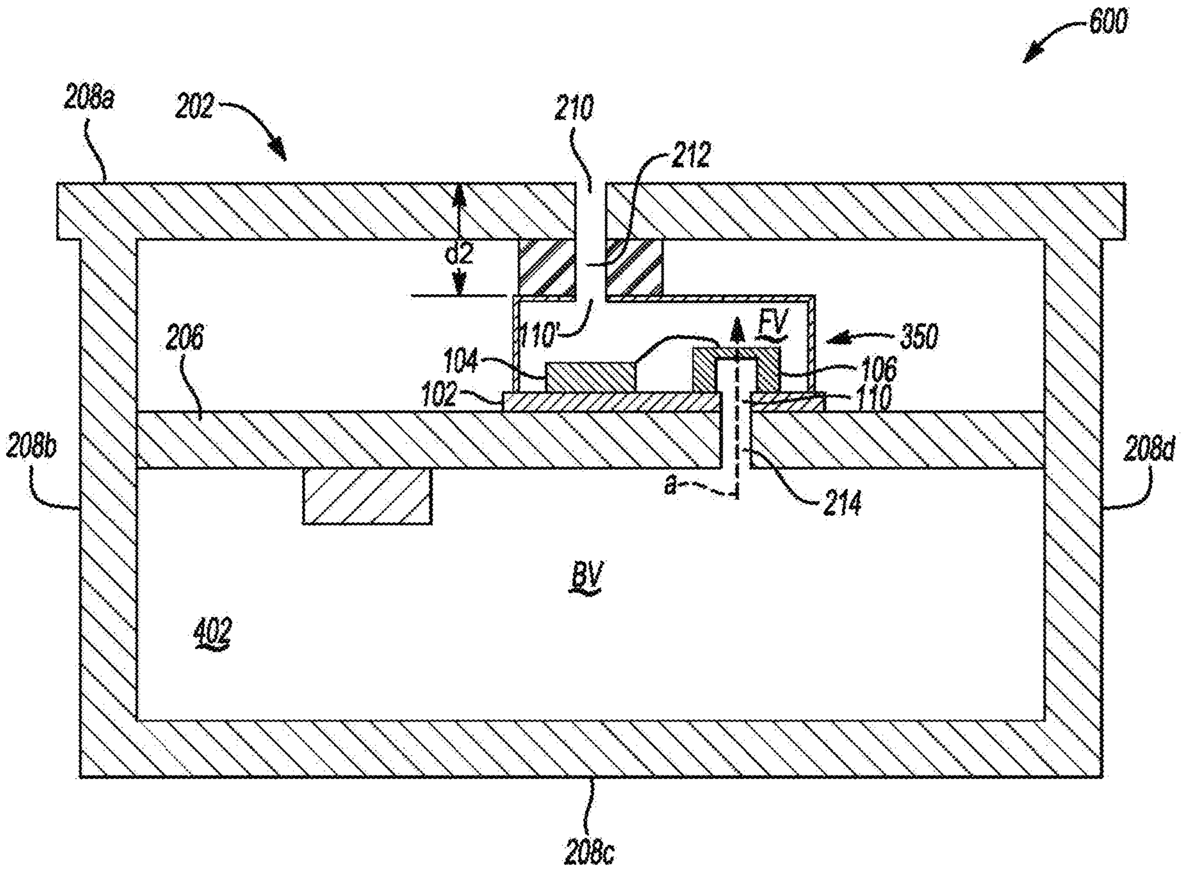
FIG. 7 depicts a cross-sectional view of a third application microphone assembly using a dual-port MEMS microphone sub-assembly in accordance with another embodiment.

FIG. 7 depicts a cross-sectional view of a third application microphone module assembly 600 using a dual-port MEMS microphone sub-assembly 350 in accordance with another embodiment. The assembly 600 is generally similar to the assembly 400 as shown in connection with FIG. 5. However, the assembly 600 employs the housing 202 to provide the cavity 402 in place of the second lid 408. For example, the housing 202 includes walls (or sides) **208*a*-208*d*. The PCB 206 along with the walls 208*b*-208*d* define the cavity 402. While not shown, it is recognized that the PCB 206 extends in circumferential directions and comes into contact with the walls 208*b* and 208*d*. The PCB 208 along with the walls 208*b*-208*d*** form an airtight seal.

The port 110 and the sound opening 214 are axially aligned with one another and provide the BV along with the cavity 402. For example, the port 110 and the sound opening 214 connects air volume trapped between the transducer 106 and the substrate 102 to the sealed cavity 402 thereby forming the BV to provide the improved SNR. The BV provided by the assembly 600 may be greater than the BV of the assemblies 400 and 500 and may provide for more improvement in SNR than such assemblies 400, 500. As seen, the assembly 600 maintains the distance d2 in reference to the distance d2 as illustrated in connection with FIG. 5. Thus, the consistent frequency response over the audio range may be achieved.

In general, the assemblies 400, 500, and 600 provide a practical solution on the microphone assembly level to simultaneously achieve the performance requirements of high SNR, wide bandwidth, and a smooth and close matching frequency response which may be challenging to achieve on the MEMS microphone level.

By adding the additional BV through the PCB 206 and either the protective housing assembly 202, the embedded cavity in the PCB 206, or the second lid 408, it is now possible to customize and adjust the microphone performance for specific applications. Traditionally, the microphone module/assembly level performance may be dominantly controlled based on the selection of the microphone element (or transducer). With the additional BV, it is possible that the SNR, signal bandwidth and frequency response can be further fine-tuned to account for unique Original Equipment Manufacturer (OEM) requirements.

MEMS Microphone with an Enhanced and Tunable Low Frequency Response

In modern vehicles, Active Noise Cancellation (ANC), also known as Active Noise Management systems employ microphones in a vehicle cabin to provide a system controller with error correction feedback. Some desirable traits for these microphones include a low cut off frequency and a good sensitivity tolerance. The low cut-off frequency generally corresponds to the point at which the frequency response of the microphone drops 3 dB from nominal. In terms of good sensitivity tolerance, ANC systems use the microphone to determine the output level of the anti-noise/cancellation signal and therefore work better when the sensitivity of the microphones are close to the specified value. The sensitivity is typically expressed as a value +/− a tolerance, measured at a specified frequency. While voice microphones usually specify their sensitivity at 1 kHz, ANC microphones do so at a lower frequency such as 30 or 100 Hz. A typical tolerance is +/−3 dB although modern systems may prefer +/−2 or +/−1 or less.

In a typical bottom port MEMS microphone as shown in connection with FIG. 1A, the volume of air included in a back chamber (e.g, BV) of the sub-assembly may determine many things. The BV may establish a low cut-off frequency in the frequency response that is of interest for ANC applications as ANC generally operates at frequencies 30-500 Hz. As the majority of MEMS microphones (or transducers 108) are used for voice applications that focus on frequencies higher than 80 Hz, such microphones are generally designed with limited BV and have less than desirable low frequency response.

Compared to traditional electret microphones (ECM) that can have a low frequency cut-off point of around 7.5 Hz or lower, a typical MEMS transducer used in ANC today cuts off at around 15~ 25 Hz due in part to the limited BV associated with typical MEMS packaging. There are specialized ANC MEMS transducers that use a larger lid which increases the BV in order to address this problem but lids that are of an odd-size or not common with the bulk of MEMS microphones present cost and manufacturing inefficiencies. One or more embodiments disclosed herein enables the use of common, lower cost components on the microphone transducer element itself while allowing for cut-off frequency enhancement/customization to be tailored on the application specific portion of the microphone assembly.

Figure 8:
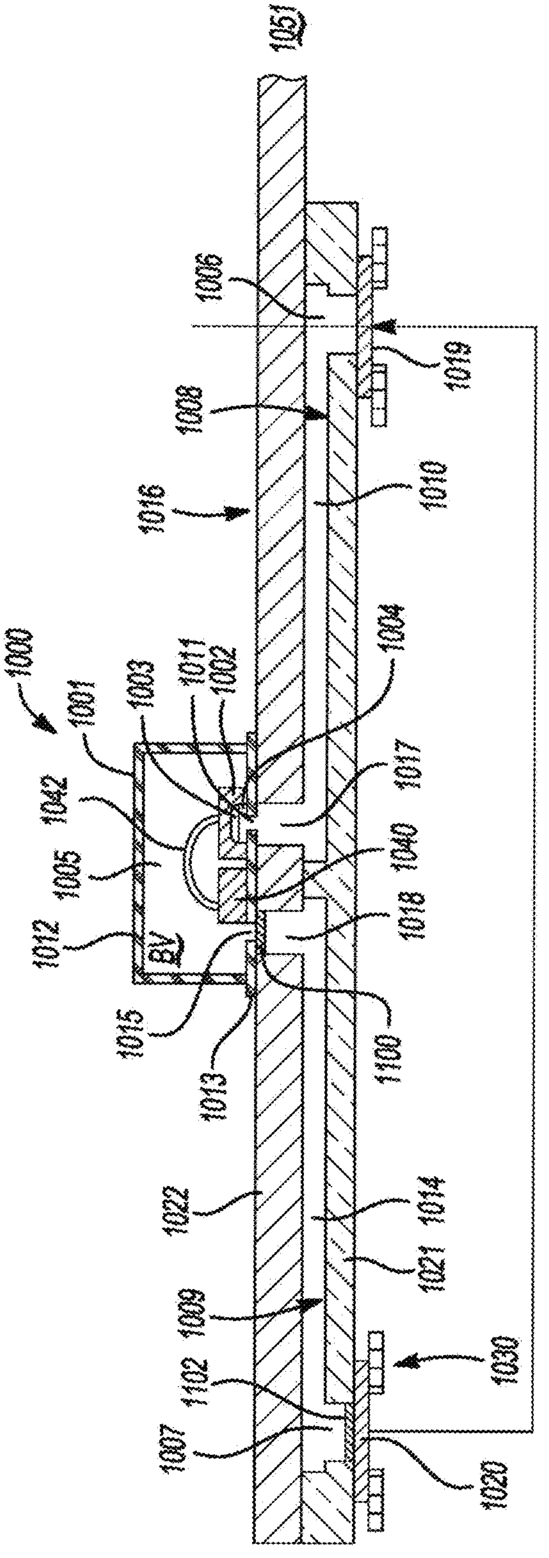
FIG. 8 depicts a microphone assembly that may be used in connection with an Active Noise Cancellation (ANC) system in accordance with one embodiment.

FIG. 8 depicts a microphone assembly 1000 in accordance with one embodiment. FIG. 1 depicts a cross sectional view of a gradient MEMS microphone assembly ("assembly") 100 in accordance with one embodiment. Various aspects related to the assembly 1000 is set forth in U.S. Pat. No. 10,154,330 as filed on Jan. 3, 2014 entitled "Gradient Micro-Electro-Mechanical Systems (MEMS) Microphone" the disclosure of which is hereby incorporated by reference herein. The assembly 1000 may operate in a frequency range of 30 to 500 Hz.

The assembly 1000 includes a single MEMS microphone ("microphone") 1001 including a single micro-machined MEMS die transducer ("transducer") 1002 with a single moving diaphragm ("diaphragm") 1003. It is recognized that a single transducer 1002 may be provided with a multiple number of diaphragms 1003. A microphone enclosure ("enclosure") 1012 is positioned over the transducer 1002 and optionally includes a base 1013.

The base 1013, when provided, defines a first acoustic port 1011 and a second acoustic port 1015. The first acoustic port 1011 is positioned below the diaphragm 1003. A first acoustic cavity 1004 is formed between the base 1013 and one side of the diaphragm 1003. A second acoustic cavity 1005 is formed at an opposite side of the diaphragm 1003. The second acoustic port 1015 abuts the second acoustic cavity 1005. The diaphragm 1003 is excited in response to an audio signal pressure gradient that is generated between the first and the second acoustic cavities 1004, 1005.

A plurality of substrate layers 1016 supports the microphone 1001. The plurality of substrate layers 1016 includes a first substrate layer 1021 and a second substrate layer 1022. In one example, the first substrate layer 1021 may be a polymer such as PCABS or other similar material. The second structure layer 1022 may be a printed circuit board (PCB) and directly abuts the enclosure 1012 and/or the base 1013. The second substrate layer 1022 may also be a polyimide or other suitable material. The plurality of substrate layers 1016 mechanically and electrically support the microphone 1001 and enable the assembly 1000 to form a standalone component for attachment to an end user assembly (not shown). The plurality of substrate layers 1016 form or define a first transmission mechanism (generally shown at "1008") and a second transmission mechanism (generally shown at "1009"). The first transmission mechanism 1008 generally includes a first sound aperture 1006, a first acoustic tube 1010, and a first acoustic hole 1017. The second transmission mechanism 1009 generally includes a second sound aperture 1007, a second acoustic tube 1014, and a second acoustic hole 1018. An audio input signal (or sound) is generally received at the first sound aperture 1006 and at the second sound aperture 1007 and subsequently passed to the microphone 1001. This will be discussed in more detail below.

The base 1013 defines a first acoustic port 1011 and a second acoustic port 1015. As noted above, the base 1013 may be optionally included in the microphone 1001. If the base 1013 is not included in the microphone 1001, the first acoustic hole 1017 may directly provide sound into the first acoustic cavity 1004. In addition, the second acoustic hole 1018 may directly provide sound into the second acoustic cavity 1005.

The second substrate layer 1022 is substantially planar to support the microphone 1001. The first and the second acoustic tubes 1010 and 1014 extend longitudinally over the first substrate layer 1021. The first sound aperture 1006 is separated from the second sound aperture 1007 at a delay distance d. The first and the second sound apertures 1006 and 1007, respectively, are generally perpendicular to the first and the second acoustic tubes 1010 and 1014, respectively. The first and the second acoustic holes 1017, 1018 are generally aligned with the first and the second acoustic ports 1011 and 1015, respectively.

A first acoustic resistance element 1019 (e.g., cloth, sintered material, foam, micro-machined or laser drilled hole arrays, etc.) is placed on the first substrate layer 1021 and about (e.g., across or within) the first sound aperture 106. A second acoustic resistance element 1020 (e.g., cloth, sintered material, foam, micro-machined or laser drilled hole arrays, etc.) is placed on the first substrate layer 1021 about (e.g., across or within) the second sound aperture 1007. It is recognized that the first and/or second acoustic resistance elements 1019 and 1020 may be formed directly within the transducer 1002 while the transducer 1002 undergoes its micromachining process. Alternatively, the first and/or the second acoustic resistance elements 1019 and 1020 may be placed anywhere within the first and the second transmission mechanisms 1008 and 1009, respectively.

At least one of the first and the second acoustic resistance elements 1019, 1020 are arranged to cause a time delay with the sound (or ambient sound) that is transmitted to the first sound aperture 1006 and/or the second sound aperture 1007 and to cause directivity (e.g., spatial filtering) of the assembly 1000. In one example, the second acoustic resistance element 1020 includes a resistance that is greater than three times the resistance of the first acoustic resistance element 1019. In addition, the second acoustic cavity 1005 may be three times larger than the first acoustic cavity 1004.

In general, the first and the second acoustic resistance elements 1019, 1020 are formed based on the size restrictions of the acoustical features such as apertures, holes, or tube cross-sections of the first and the second transmission mechanisms 1008 and 1009. The first transmission mechanism 1008 enables sound to enter the microphone 1001 (e.g., into the first acoustic cavity 1004 on one side of the diaphragm 1003). The second transmission mechanism 1009 and the second acoustic port 1015 (if the base 1013 is provided) enable the sound to enter into the microphone 1001 (e.g., into the second acoustic cavity 1005 on one side of the diaphragm 1003). In general, the microphone 1001 (e. g., acoustic gradient microphone) receives the sound from a sound source and such a sound is routed to opposing sides of the moveable diaphragm 1003 with a delay in time with respect to when the sound is received. The diaphragm 1003 is excited by the signal pressure gradient between the first acoustic cavity 1004 and the second acoustic cavity 1005.

The delay is generally formed by a combination of two physical aspects. First, for example, the acoustic sound (or wave) takes longer to reach one entry point (e.g., the second acoustic aperture 1007) into the microphone 1001 than another entry point (e.g., the second acoustic aperture 1006) since the audio wave travels at a speed of sound in the first transmission mechanism 1008 and the second transmission mechanism 1009. This effect is governed by the spacing or the delay distance, d between the first sound aperture 1006 and the second sound aperture 1007 and an angle of the sound source, θ. In one example, the delay distance d may be 12.0 mm. Second, the acoustic delay created internally by a combination of resistances (e.g., resistance values of the first and the second acoustic resistance elements 1019 and 1020) and acoustic compliance (volumes) creates the desired phase difference across the diaphragm.

If the sound source is positioned to the right of the assembly 1000, any sound generated therefrom will first reach the first sound aperture 1006, and after some delay, the sound will enter into the second sound aperture 1007 with an attendant relative phase delay in the sound thereof. Such a phase delay assists in enabling the microphone 1001 to achieve desirable performance. As noted above, the first and the second sound apertures 1006 and 1007 are spaced at the delay distance "d". Thus, the first acoustic tube 1010 and the second acoustic tube 1014 are used to transmit the incoming sound to the first acoustic hole 1017 and the second acoustic hole 1018, respectively, and then on to the first acoustic port 1011 and the second acoustic port 1015, respectively. The plurality of substrate layers includes a shared electrical connection 1051 which enable the first substrate layer 1021 and the second substrate layer 1022 to electrically communicate with one another.

The assembly 1000 is generally considered to be a uni-directional microphone. However, ANC microphones are generally omni-directional and sense sound in all directions. As noted above, it is possible to tailor the acoustic response of the MEMS transducer based on external components to the MEMS transducer. In terms of the assembly 1000, components positioned below the plurality of substrate layers 1016 may be considered to be external to the MEMS transducer 1001. Thus, the assembly 1000 adds a seal 1100 to the second acoustic port 1015 to cause the assembly 1000 to function as an omni-directional microphone which may be used in connection with ANC applications. The seal 1100 completely prevents (or blocks) the audio signal from entering into the enclosure 1012 or from being received by the diaphragm 1003 (or the MEMS transducer 1002. Additionally, or alternatively, a seal 1102 may also be placed at the second sound aperture 1007 as opposed to being placed at the second acoustic port 1015 and may also block the audio signal from entering into the enclosure 1012 or from being received by the MEMS transducer 1002. It is also recognized that the first transmission mechanism 1008 (i.e., the first acoustic hole 1017) enables the MEMS transducer 1002 to receive the audio signal from the environment external to the assembly 1000'.

The enclosure 1012 and the base 1013 (or substrate 1022) define a first volume of air. The second sound aperture 1007, the second acoustic tube 1014, the second acoustic hole 1018, and the second acoustic port 1015 define a second volume of air. The first volume of air and the second volume of air, when combined, provide a back volume (BV) of air.

Figure 9:
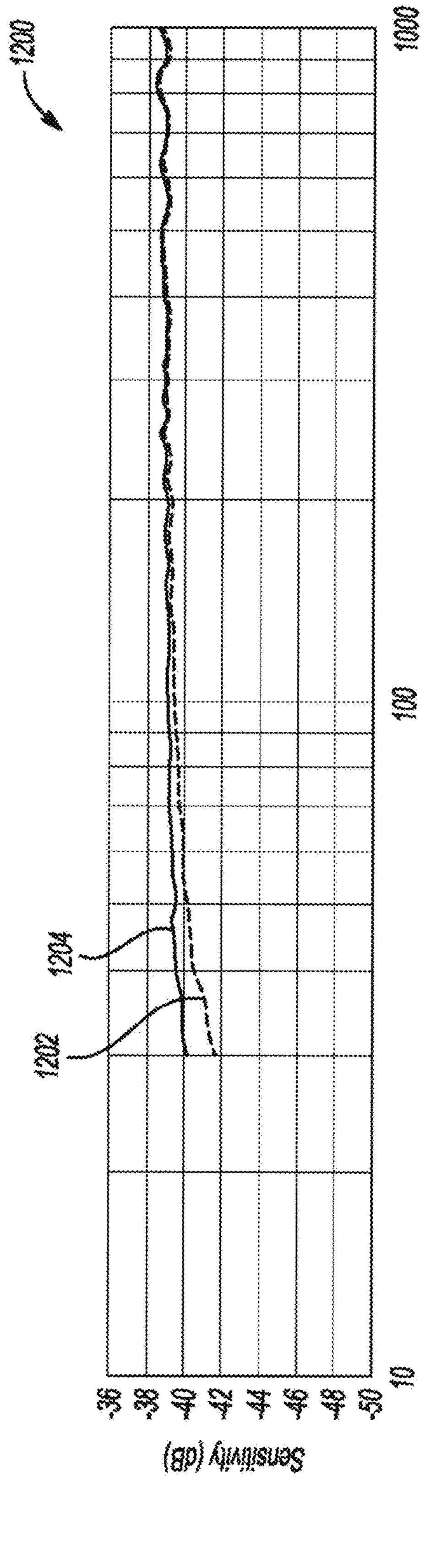
FIG. 9 depicts a plot including waveforms corresponding to frequency and sensitivity in accordance with one embodiment.

FIG. 9 depicts a plot 1200 having waveforms 1202 and 1204 corresponding to frequency and sensitivity in accordance with one embodiment. Waveform 1202 depicts the frequency in relation to sensitivity in the event the second acoustic port 1015 is sealed or closed via the seal 1100. Waveform 1204 depicts the frequency in relation to sensitivity in the event the second sound aperture 1007 is sealed or closed via the seal 1102. Waveform 1204 exhibits an improvement of 2 dB at 30 Hz and may be more favorable for ANC application than that exhibited by the waveform 1202. In other words, the utilization of the seal 1102 at the second sound aperture 1007 may be preferred over placing the seal 1100 to the second acoustic port 1015. For example, by placing the seal 1102 at the second sound aperture 1007, it may be possible to add back volume (or BV as noted above) which provides the response changes as illustrated with the plot 1200.

In one example, the frequency response performance for the ECM may be −1 dB from nominal (e.g., 100 Hz to 30 Hz). In other words, the performance only drops off at 1 dB in an entire region of ANC as defined as 30-500 Hz. The waveform 1202 illustrates that from nominal to 30 Hz the frequency response may be −3 dB while the waveform 1204 illustrates a frequency response of −1 dB. This aspect exhibits that the embodiments of the present invention may match the frequency response provided by ECM which may be advantageous.

Referring back to the assembly 1000 as illustrated in FIG. 8, it is recognized that the first acoustic tube 1010, the first sound aperture 106, and first acoustic resistance element 1019 may not be required for the implementation (or for the assembly 1000). In this case, the first acoustic hole 1017 may directly be open to the environment.

In this embodiment, the assembly 1000 may have a smaller footprint and may be more advantageous for use when the assembly 1000 is required to fit into smaller packaging spaces or profiles. In general, the features are illustrated to serve as examples of additional features that may be optionally included and also utilized for research and development testing. The assembly 1000 as illustrated in connection with FIG. 8 attempts to increase the BV for components externally located to the transducer 1000 to increase the low frequency response, in particular, for ANC applications.

Figure 10:
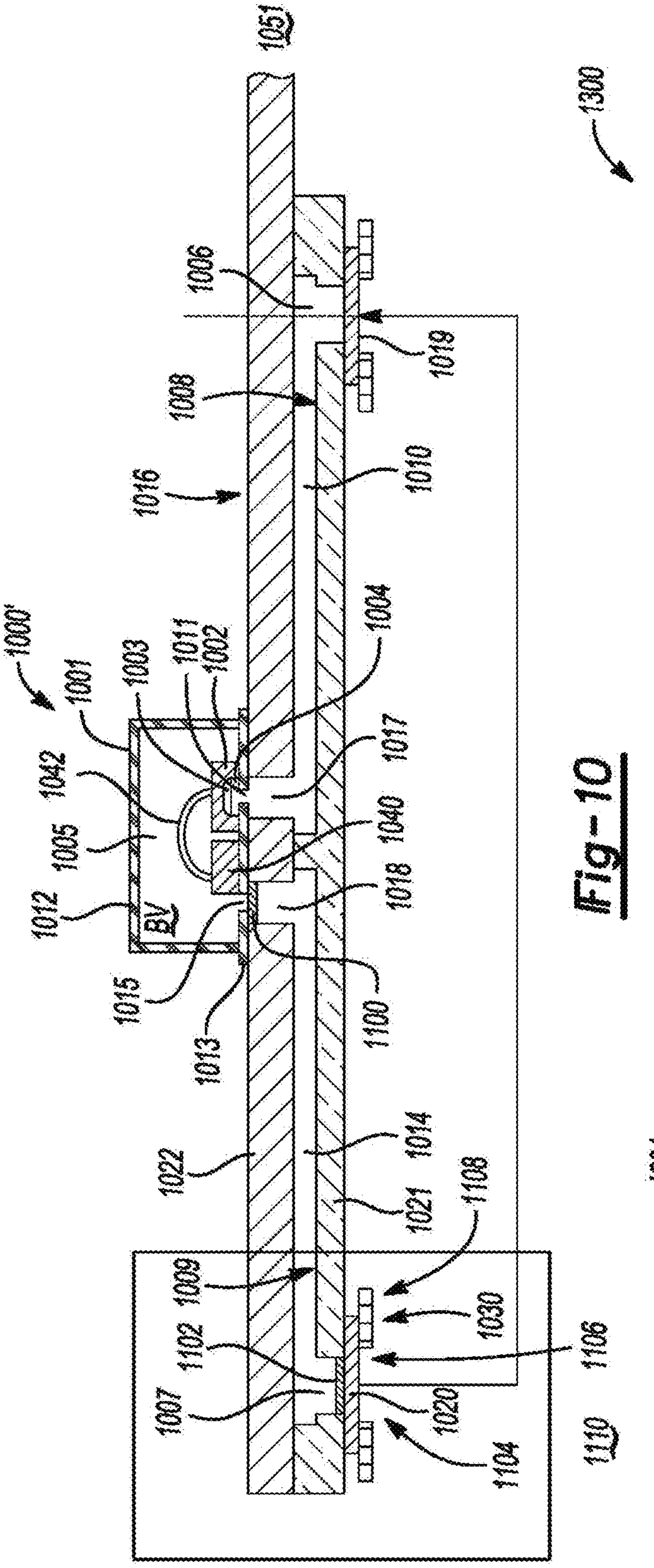
FIG. 10 depicts another microphone assembly that may be used in connection with the ANC system in accordance with one embodiment.

The implementations as illustrated in connection with FIGS. 5 and 6 may achieve, for example, the advantage of a top port MEMS to achieve the shortest acoustic path while maintaining a bottom-port based MEMS microphone performance to achieve a high SNR. FIG. 10 depicts another microphone assembly 1000' that may be used in connection with the ANC system in accordance with one embodiment. The assembly 1000' may operate in a frequency range of 30 to 500 Hz. The assembly 1000' is generally similar to the assembly 1000. However, the assembly 1000' provides for a variable back volume (VBV). The VBV may enhance the desired trait of good sensitivity tolerance which corresponds to the control of manufacturing/assembly tolerance for microphone sensitivity at a specified frequency. Similar to FIG. 8, the enclosure 1012 and the base 1013 define a first volume of air. The second sound aperture 1007, the second acoustic tube 1014, the second acoustic hole 1018, and the second acoustic port 1015 define a second volume of air. The first volume of air and the second volume of air, when combined, provide the BV of air.

When a MEMS microphone or assembly is manufactured, numerous factors affect the ANC microphone's sensitivity specification and frequency response. One example of such a factor may include the utilization of an adhesive to attach to the microphone lid to the MEMS microphone. Excess adhesive may collect inside the BV causing variation in the realized BV which therefore adds sensitivity variations. Furthermore, additional sensitivity variations may be added once a MEMS microphone is placed into an assembly and/or subjected to processes such as wave soldering. This may result in a large sensitivity tolerance which makes it undesirable for ANC applications. Such tolerance is undesirable and results in the need for a more relaxed sensitivity specification and excessive scrap during manufacturing. The embodiments as set forth herein address these issues.

The assembly 1000' also includes the seal 1102 which may be positioned at the second sound aperture 1007 to also create the variable BV. Since the second sound aperture 1007 is sealed (or closed) with the seal 1102, the assembly 1000' no longer requires the second acoustic resistance 1020. The seal 1102 may be made of an adhesive (e.g., tape). To create the variable BV, a needle 1104 may be inserted through and protrudes into the seal 1102 to create an opening 1106 within the seal 1102 to apply a controlled amount of potting solution 1108 (or potting material) into the second sound aperture 1007 and/or additionally into the second acoustic tube 1014. The potting solution 1108 displaces air that is captured in the BV (e.g., air in the second sound aperture 1007 and the second acoustic tube 1014 is displaced by the potting solution 1108). By controlling the amount of potting solution 1108 that is positioned in the second sound aperture 1007 and/or the second acoustic tube 1014 (e.g., BV), this adjusts or controls the low frequency response for the assembly 1000' accordingly. The application of the controlled volume of the potting solution 1108 into second sound aperture 1007 and the second acoustic tube 1014 may be performed as an operation during the manufacturing of the assembly 1000'. It is recognized that the needle 1104 and potting solution 1108 may be replaced by a plunger 1110 that is slideably inserted into the second sound aperture 1007 and/or the second acoustic tube 1014 to reduce the amount of air present in the second sound aperture 1007 and/or the second acoustic tube 1014. In this instance, the second sound aperture 1007 may be oriented positioned along the same longitudinally extending axis of the second transmission mechanism 1009 (or the second acoustic tube 1014) as shown in FIG. 10 to enable the plunger 1110 to slide into the second acoustic tube 1014. Other mechanisms may include crushing or deforming the volume as defined by the second sound aperture 1007 and/or the second acoustic tube 1014 (e.g., the BV).

In another example, the seal 1102 of the assembly 1000' may be a set screw positioned above the substrate 1022 and then inserted into an opening that extends through the substrate 1022. A user may variably insert the set screw into the opening in the substrate 1022 which then enables the set screw to reduce the amount of air present in the second sound aperture 1007 and/or second acoustic tube 1014. The opening that receives the set screw may be threaded and the user may adjust the depth at which the set screw is inserted into the opening to reach the desired amount of air that is present in the second sound aperture 1007 and/or the second acoustic tube 1014. Referring back to the needle 1104 and the potting solution 1108, during the manufacturing process, it is possible continue to inject the potting solution 1108 until the target sensitivity value is achieved and the end product assembly 1000' to meet customer applications. The displaced air in the BV may escape through pressure relief air vents typically present within MEMS microphones. In general, there may be pressure relief vent holes positioned between the FV and the BV since heat and ambient air pressure may cause excessive pressure to build in the BV if the BV was completely sealed. It is recognized that the various examples of seals (e.g., screw, plunger, potting, etc.) as noted in connection with FIG. 10 also completely prevent or block the audio signal from reaching the MEMS transducer 1002. It is also recognized that the first transmission mechanism 1008 (i.e., the first acoustic hole 1017) enables the MEMS transducer 1002 to receive the audio signal from the environment external to the assembly 1000'.

Figure 11:
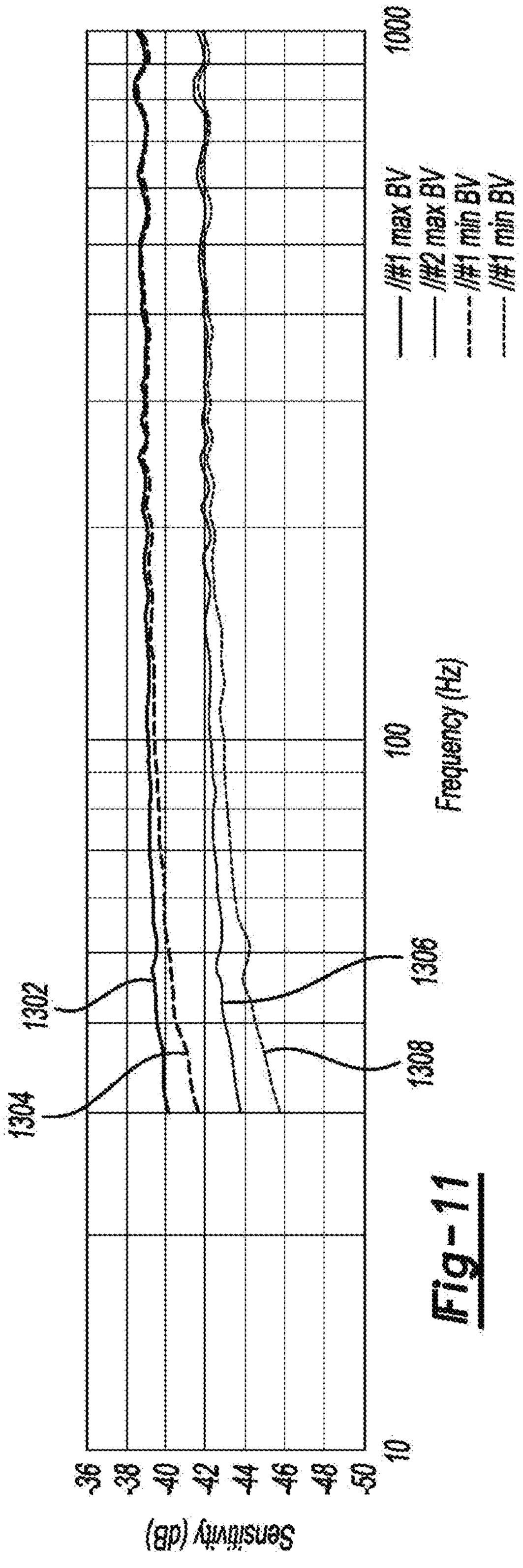
FIG. 11 depicts another plot including waveforms corresponding to frequency and sensitivity in accordance with one embodiment.

FIG. 11 depicts another plot 1300 having waveforms corresponding to frequency and sensitivity in accordance with one embodiment. The plot 1300 corresponds to waveforms 1302, 1304, 1306, 1308 for two microphone assemblies (e.g., a first microphone assembly and a second microphone assembly). For example, waveforms 1302, 1304 may correspond to a frequency response and sensitivity level (e.g., 30 Hz) for the first microphone assembly and waveforms 1306, 1308 may correspond to a frequency and sensitivity level for the second microphone assembly.

Waveform 1302 may correspond to the overall frequency response in the event the first microphone assembly includes the seal 1102 being positioned in the second sound aperture 1007 and the second sound aperture 1007 and/or the second acoustic tube 1014 (e.g., in the BV) are empty (or full of air). Waveform 1304 may correspond to the overall frequency response in the event the first microphone assembly includes the seal 1102 being positioned in the second sound aperture 1007, and the potting solution 108 completely fills the second sound aperture 1007 and the second acoustic tube 1014 (e.g., in the BV). Waveform 1302 exhibits approximately a 2 dB improvement at 30 Hz in comparison to the waveform 1304.

Waveform 1306 may correspond to the overall frequency response in the event the first microphone assembly includes the seal 1102 being positioned in the second sound aperture 1007 and the second sound aperture 1007 and/or the second acoustic tube 1014 (e.g., in the BV) are empty (or full with air). Waveform 1308 may correspond to the overall frequency response in the event the first microphone assembly includes the seal 1102 being positioned in the second sound aperture 1007, and the potting solution 108 completely fills the second sound aperture 1007 and the second acoustic tube 1014 (e.g., in the BV). Waveform 1306 exhibits approximately a 2 dB improvement at 30 Hz in comparison to the waveform 1308. Given that the waveforms 1032 and 1036 mirror the untuned assembly to assembly sensitivity variation, the first and the second microphone assemblies exhibit a 30 Hz sensitivity difference of approximately 4 dB.

Figure 12:
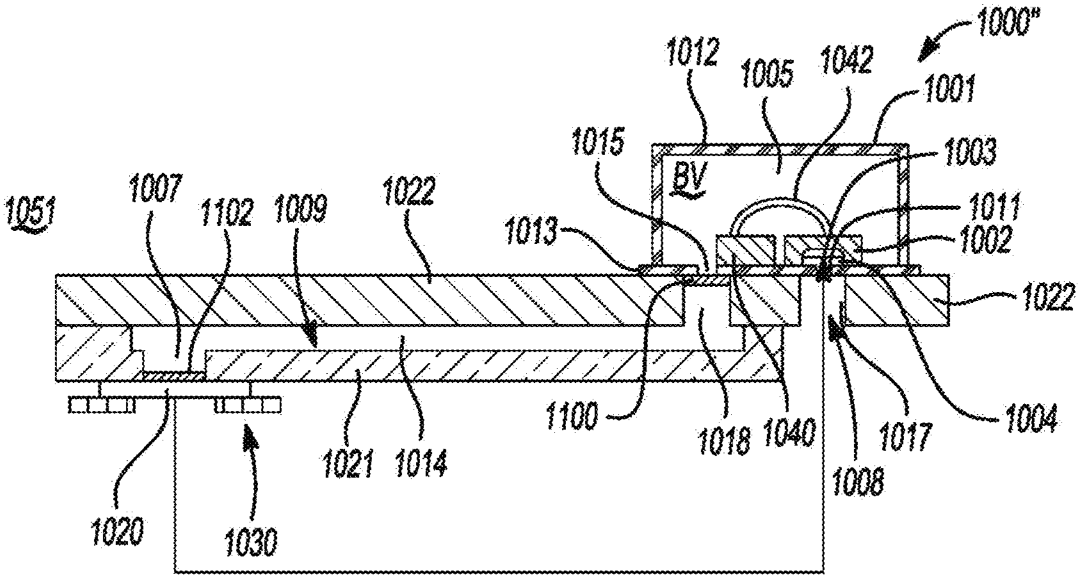
FIG. 12 depicts another microphone assembly that may be used in connection with the ANC system in accordance with one embodiment.

FIG. 12 depicts another microphone assembly 1000" that may be used in connection with the ANC system in accordance with one embodiment. The assembly 1000" The assembly 1000' is generally similar to the assemblies 1000 and 1000'. The assembly 1000" incudes the seal 1102 may also provide the variable BV. Similar to FIG. 8, the enclosure 1012 and the base 1013 define a first volume of air. The second sound aperture 1007, the second acoustic tube 1014, the second acoustic hole 1018, and the second acoustic port 1015 define a second volume of air. The first volume of air and the second volume of air, when combined, provide the BV of air. The assembly 1000" differs from the assemblies 1000 and 1000' in that the first transmission mechanism 1008 only include the first acoustic hole 1017 (i.e., the first transmission mechanism 1008 does not include the first sound aperture 1006 and the first acoustic tube 1010). In this regard, the overall footprint or packaging space offered by the assembly 1000" may be reduced in comparison to the assemblies 1000 and 1000'. It is recognized that the assembly 1000" may continue to achieve the benefits obtained by the assemblies 1000 and 1000' as noted above. The seal 1100 or 1102 completely prevents the audio signal from being received at the MEMS transducer 1002. The first transmission mechanism 1008 (i.e., the first acoustic hole 1017) enables the MEMS transducer 1002 to receive the audio signal from the environment external to the assembly 1000'.

A tuning method may be provided for the variable BV based microphone assembly. The method generally includes manufacturing the assembly and performing an acoustic test at end of line. The method also includes utilizing test data to change the microphone assembly BV (e.g., insert potting solution or other filler to adjust the BV of the microphone assembly), and confirming the desired microphone assembly performance.

Figure 13:
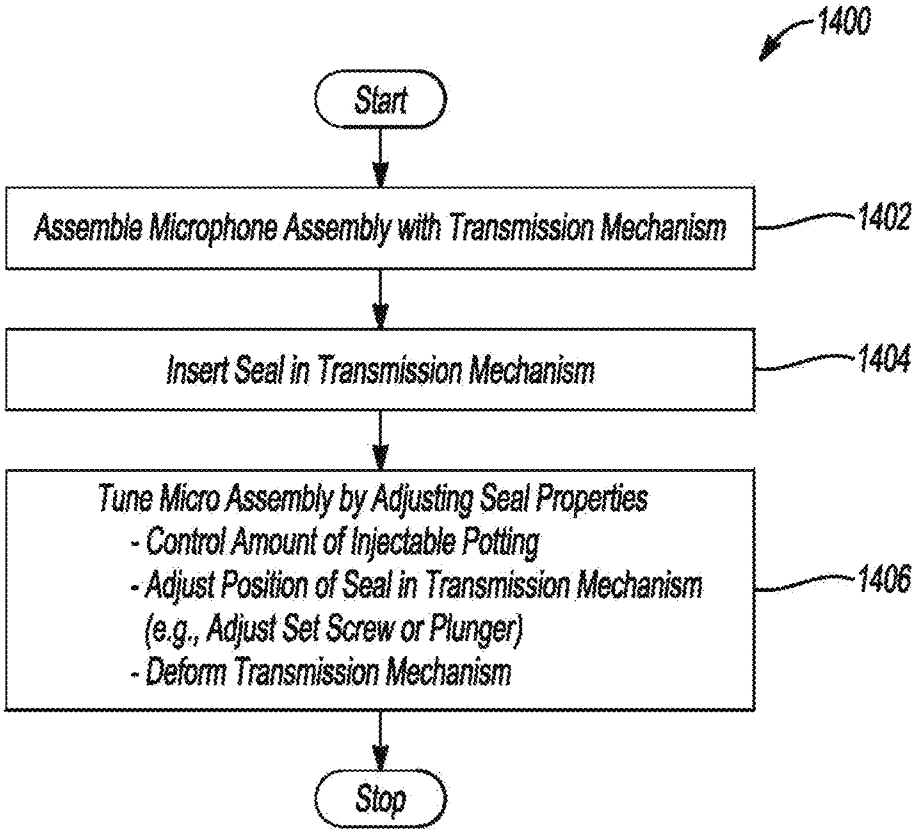
FIG. 13 depicts a method for tuning the microphone assembly in accordance with one embodiment.

FIG. 13 depicts an example method 1400 for tuning the microphone assembly in accordance with one embodiment. In operation 1402, the microphones assembly 1000, 1000', and 1000" is assembled with the first and the second transmission mechanisms 1008 and 1009. In operation 1404, the seal 1102 is inserted into the second transmission mechanism 1008.

In operation 1406, the microphone assembly 1000, 1000', 1000" is tuned by adjusting various properties of the seal 1102. For example, the needle 1104 may be penetrate the seal 1102 and apply a controlled amount of potting solution 1108 into the second transmission mechanism 1009. The amount of potting material 1108 that is applied may vary based on the desired tuning properties that are required. In another example, the set screw may be inserted to reduce the amount of amount of air present in the second sound aperture 1007 and/or the second acoustic tube 1104. As noted above, the user may adjust the depth at which the set screw is inserted into the opening to reach the desired amount of air that is present in the second sound aperture 1007 and/or the second acoustic tube 1014. In another example, the plunger 1110 is slideably inserted into the second sound aperture 1007 and/or the second acoustic tube 1014 to reduce the amount of air present in the second sound aperture 1007 and/or the second acoustic tube 1014. In another example, the method 1400 may include crushing or deforming the volume as defined by the second sound aperture 1007 and/or the second acoustic tube 1014.

It is recognized that an end of line testing sequence may be employed to determine the appropriate air volume necessary to shape the frequency response characteristics for the static based BV microphone assembly and the variable based BV microphone assembly. Various benefits/advantages may be achieved based on the disclosed embodiments. For example, the embodiments disclosed herein generally provide for the ability to enhance the low frequency cut off as needed or desired based on the given application of the microphone assembly. In addition, the disclosed microphone assemblies generally provide for enhanced sensitivity tolerance in which a first microphone assembly may have a minimum BV (e.g., BV is filled with potting solution or other suitable filler) and a second microphone assembly may have a maximum BV (e.g., volume defined by seal and other components of the microphone assembly is simply filled with air). This results in matched microphones that may be 2 dB apart at 30 Hz as opposed to 4 dB. In addition, ANC based microphone assembly may be built with a standard low-profile lid that is shared with their high-volume voice counterparts.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A microphone assembly comprising:

a substrate that defines a first port that extends completely therethrough;

a printed circuit board (PCB) defining a sound opening that extends completely therethrough;

a micro-electro-mechanical systems (MEMS) transducer positioned on a first side of the substrate and being positioned directly above the first port and the sound opening;

a first lid defining a second port and covering the MEMS transducer and the first port, and the first port being axially displaced from the second port, the first lid and the substrate define a front volume of air that surrounds the MEMS transducer;

at least a portion of a housing being positioned on a second side of the PCB and opposite to the first side of the PCB and defining a cavity, the at least the portion of the housing including a first wall that defines a sound aperture; and a gasket defining a sound hole that extends completely therethrough, wherein the gasket includes a first side that is coupled to the at least the portion of the housing and the sound hole of the gasket is axially aligned with the sound aperture, wherein the cavity of the at least the portion of the housing, sound port of the PCB, and the first port of substrate define a back volume of air that is greater than the front volume of air to increase a signal-to-noise-ratio (SNR) and to increase an overall frequency response for the microphone assembly.

2. The microphone assembly of claim 1, wherein the at least the portion of the housing includes one or more walls that partially enclose the first lid.

3. The microphone assembly of claim 1, wherein the gasket includes a second side that is opposite to the first side and the second side of the gasket is coupled to the first lid.

4. The microphone assembly of claim 3, wherein the sound hole of the gasket is axially aligned with the sound aperture of the housing and the second port of the first lid.

* * * * *